(12) United States Patent
Lai

(10) Patent No.: US 7,024,275 B2
(45) Date of Patent: Apr. 4, 2006

(54) CONTROL METHOD AND SYSTEM FOR AN AUTOMATED MATERIAL HANDLING SYSTEM

(75) Inventor: Samson Lai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/701,579

(22) Filed: Nov. 5, 2003

(65) Prior Publication Data
US 2005/0096784 A1   May 5, 2005

(51) Int. Cl.
*G06F 7/00* (2006.01)
(52) U.S. Cl. ...................... 700/228; 700/112
(58) Field of Classification Search ............. 700/228, 700/112, 113, 121; 414/940
See application file for complete search history.

(56) References Cited

U.S. PATENT DOCUMENTS

| | | | |
|---|---|---|---|
| 5,379,229 A | | 1/1995 | Parsons et al. |
| 6,157,866 A * | | 12/2000 | Conboy et al. ............ 700/121 |
| 6,183,186 B1 * | | 2/2001 | Howells et al. ......... 414/416.03 |
| 6,351,686 B1 * | | 2/2002 | Iwasaki et al. ............. 700/228 |
| 6,398,476 B1 * | | 6/2002 | Ando ........................ 414/282 |
| 6,612,797 B1 * | | 9/2003 | Bonora et al. .............. 414/217 |
| 6,641,350 B1 * | | 11/2003 | Nakashima et al. ........ 414/217 |
| 6,672,032 B1 * | | 1/2004 | Van Der Burgt et al. ..... 53/390 |

OTHER PUBLICATIONS

Joe Reiss, "PRI Automation", Semiconductor Magazine, Feb. 2002 vol. 3, No. 2 in http:dom.semi.org/web/wmagazine.nsf/0/0c7ce545bedcd07788256b45c005aab87?Open D Aug. 28, 2003.

* cited by examiner

Primary Examiner—Khoi H. Tran
(74) Attorney, Agent, or Firm—Duane Morris LLP

(57) ABSTRACT

An automated material handling system for a semiconductor fabrication facility includes: at least one processing tool that performs a semiconductor fabrication process on semiconductor wafers, at least one stocker capable of holding at least one lot of semiconductor wafers, and first and second transports. The second transport moves a second lot of semiconductor wafers from the stocker to a loadport of the processing tool after a first lot of semiconductor wafers is processed by the tool. The first transport moves an empty vehicle into position to remove the first lot of semiconductor wafers from the tool while the second lot of semiconductor wafers is being moved. The first transport removes the first lot of semiconductor wafers from the tool with the vehicle while the second lot of semiconductor wafers is being moved.

5 Claims, 7 Drawing Sheets

CONTROL METHOD AND SYSTEM FOR AN AUTOMATED MATERIAL HANDLING SYSTEM

FIELD OF THE INVENTION

The present invention relates to control systems generally, and more specifically to a control method and system for an automated material handling system (AMHS).

BACKGROUND

AMHS's have been used extensively in the semiconductor fabrication field. The typical system includes a plurality of bays (rows) of storage areas. Each bay has a stocker, which includes bins for holding a plurality of containers, such as standard mechanical interfaces (SMIFs) for loading 200 mm (8 inch) wafers, or front opening unified pods (FOUPs), which may be used to load 300 mm (12 inch) wafers. The stocker holds the SMIFs or FOUPs in preparation for transporting a SMIF or FOUP to the loadport of a processing tool. An overhead hoist transport (OHT) associated with each bay transports the SMIF or FOUP with wafers from the stocker to a loadport for processing in one of the tools (fabrication process machines). The OHT also moves empty vehicles to the loadport to receive processed wafers to remove from the tool.

AMHS's suitable for use in fabricating 200 mm wafers are in a mature state, whereas AMHS systems for use in 300 mm wafer fabrication include many new design features. An important factor in designing the newer AMHS systems is efficiency. Key indices are defined to monitor the efficiency of the AMHS, and that efficiency has a direct impact on the operation of the fabrication facility (fab). The operation service time (OST) has been defined as a key index to monitor AMHS intrabay efficiency by tool loadport. The OST is a measure of how long an operator must wait to receive a lot of wafers (for processing) after a retrieval command is sent to the stocker. The AMHS is triggered to pick up a lot of wafers and then, when the lot has completed on the tool loadport, the AMHS inputs the next lot on the loadport.

FIG. 1 shows a conventional AMHS workflow. In a known system, the intrabay operation is as follows. When the lot 22 of wafers is processed, a "remove" command is issued by the loadport of tool 21. The intrabay OHT receives the request, and the AMHS dispatches an empty vehicle 31 to pick up the processed lot 22, as shown by arrow 11. The lot 22 is transferred to the empty vehicle 31, in a step indicated by arrow 12. This time period from when the loadport issues a "remove" command to when the lot 22 is picked up from the tool 21 is referred to as the OST-out-time. Next, the empty loadport issues a "move-in" command to request the next lot 24. The intrabay OHT delivers a next lot 24 to the empty tool loadport, shown by arrows 13–15. The stocker 23 transfers the next lot 24 to a vehicle 32, in a step indicated by arrow 13. The vehicle 32 moves to the location of the tool 21, in a step indicated by arrow 14. The lot 24 is input, as shown by arrow 15. The time for this operation is called the OST-in-time. In a typical system, the total cycle time for this operation is the OST-out-time plus the OST-in-time. For example, if the OST-out-time is about 1 minute and the OST-in-time is about 3.5 minutes, the total time to move the next lot to the loadport is 4.5 minutes.

It would be desirable to reduce the transfer time required by the AMHS.

SUMMARY OF THE INVENTION

In some embodiments, a method for operating an automated material handling system comprises the steps of: moving a second lot of workpieces to a loadport of a processing tool after a first lot of workpieces is processed by the tool; moving an empty vehicle into position to remove the first lot of workpieces while the second lot of workpieces is being moved; and removing the first lot of workpieces from the tool with the vehicle while the second lot of workpieces is being moved.

In some embodiments, an automated material handling system for a semiconductor fabrication facility includes: at least one processing tool that performs a semiconductor fabrication process on semiconductor wafers, at least one stocker capable of holding at least one lot of semiconductor wafers, and first and second transports. The second transport moves a second lot of semiconductor wafers from the stocker to a loadport of the processing tool after a first lot of semiconductor wafers is processed by the tool. The first transport moves an empty vehicle into position to remove the first lot of semiconductor wafers from the tool while the second lot of semiconductor wafers is being moved. The first transport removes the first lot of semiconductor wafers from the tool with the vehicle while the second lot of semiconductor wafers is being moved.

DETAILED DESCRIPTION

In an exemplary embodiment, the total cycle time for the AMHS can be reduced by a period of up to the OST-out-time. The sequence of the intrabay operation is modified as described below. In some embodiments, the method includes moving a second lot of workpieces to a loadport of a processing tool after a first lot of workpieces is processed by the tool; moving an empty vehicle into position to remove the first lot of workpieces while the second lot of workpieces is being moved; and removing the first lot of workpieces from the tool with the vehicle while the second lot of workpieces is being moved.

Figure 2:
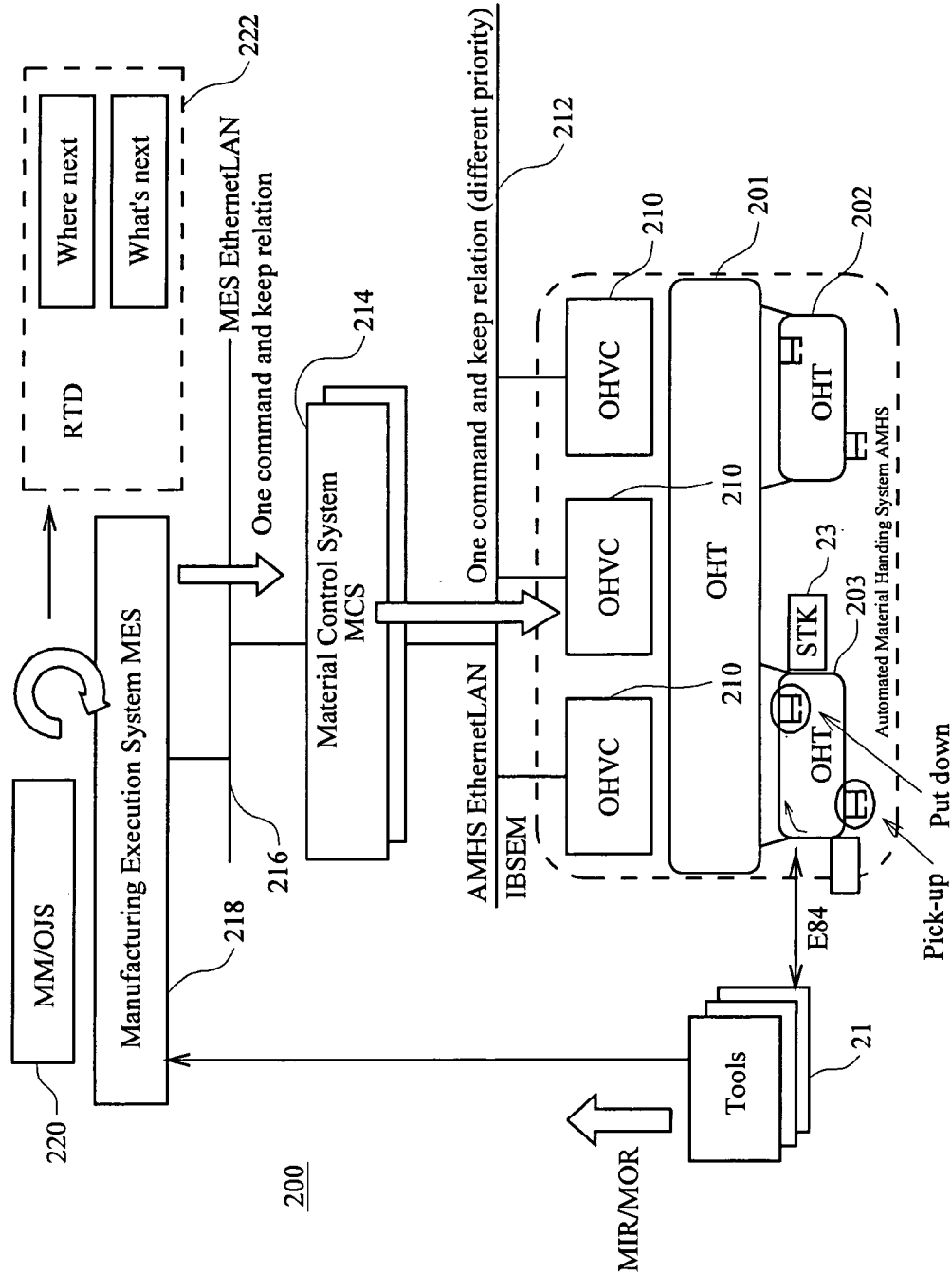
FIG. 2 is a diagram of an AMHS according to one embodiment of the invention.

FIG. 2 shows an exemplary AMHS 200 in which the method may be performed. A stocker 23 stores lots of wafers for processing by tools 21. Overhead transports (OHT) 201–203 convey the lots of wafers between the stocker 23 and the loadports of tools 21. The interbay OHT 201 exchanges SMIFs and/or FOUPs with the intrabay OHTs 202 and 203. Each intrabay OHT 202, 203 may handle containers for a respective stocker 23. A plurality of overhead hoist vehicle controllers (OHVC) 210 provide the interface between the control software of the Material Control System (MCS) 214 and the hardware of the OHTs. The OHVCs 210 act as special purpose process controllers for this purpose. A local area network (LAN) such as the AMHS Ethernet LAN 212 connects the MCS 214 and the OHCVs 210. A manufacturing execution system (MES) 218 operates at an application level to control the sequence of the commands performed by the AMHS. MES 218 may be connected to the MCS by another LAN 216. A user interface is provided by manufacturing management/operation job supervisor (MM/OJS) software 220. MM/OJS 220 interacts with the MES 218 and a real-time dispatcher (RTD) 222. The stocker 23, OHTs 201–203 and OHVCs 210 may be part of a commercially available AMHS equipment package.

The MM/OJS 220, MES 218 and MCS 214 may operate on general purpose computers of any architecture. Preferably, these applications operate on workstations or desktop or laptop computers running a conventional operating system, such as, for example, a version of the UNIX operating system, or the "WINDOWS" operating system by Microsoft Corporation of Redmond, Wash. Although Ethernet LANs are shown, any wired or wireless LAN architecture may be used.

Figure 3:
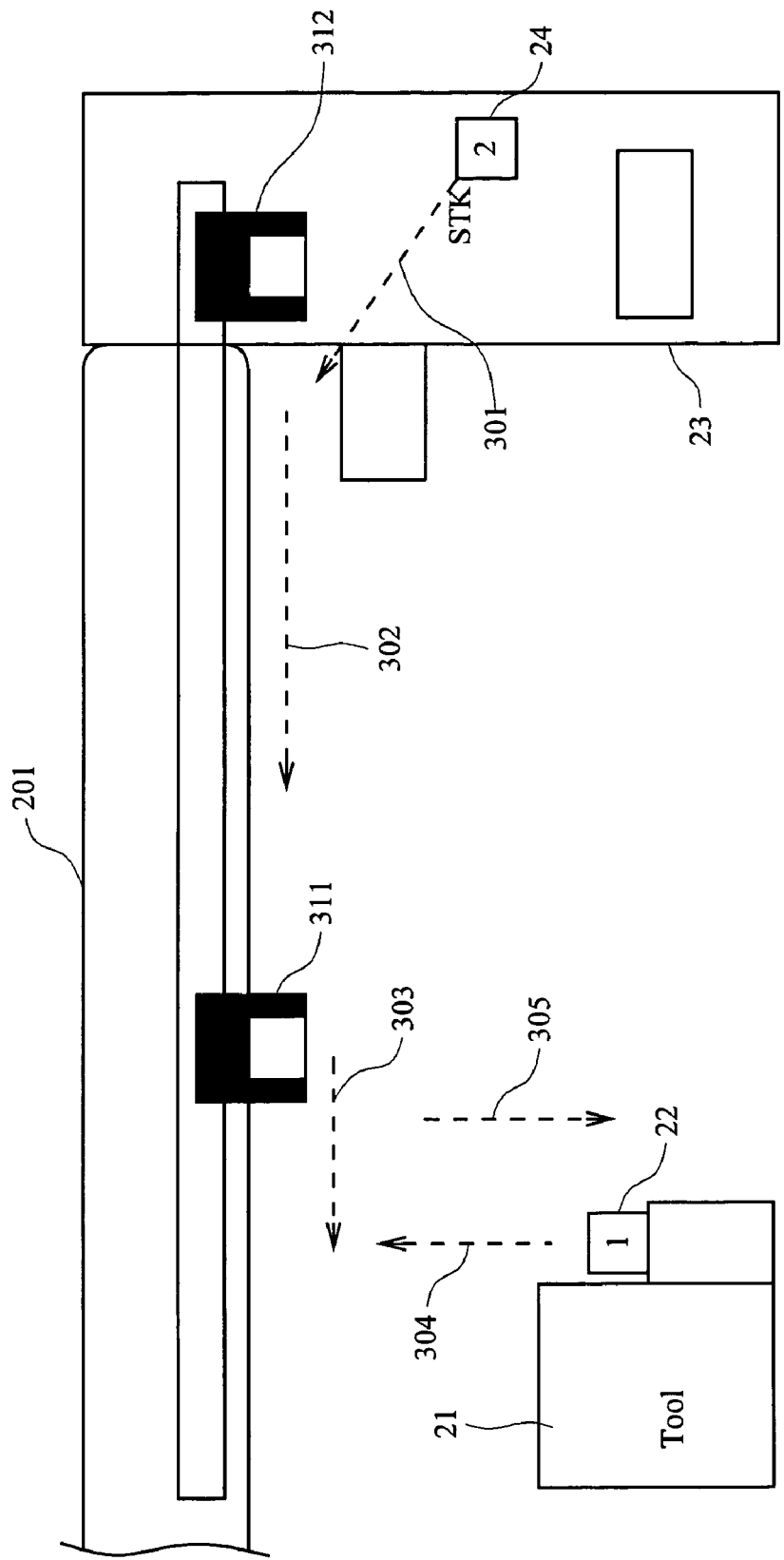
FIG. 3 is a diagram of a method for operating the AMHS of FIG. 2 according to some embodiments of the invention.

FIG. 3 shows an exemplary sequence. The operation service cycle is divided into two operations that can be performed concurrently. The first operation includes steps 301, 302, and 305, and the second operation includes steps 303–304.

At step 301, the stocker 23 transfers a new lot 24 of wafers to a vehicle 312 for transport by the OHT 201. At step 302, the OHT 201 moves the new lot 24 to the loadport of tool 21. Concurrently, the other sequence containing steps 303–304 is performed. At step 303, an empty vehicle 311 moves to the loadport. At step 304, the processed lot 22 is transferred from the loadport to the empty vehicle 311 and removed. Step 305 can be performed any time after both steps 302 and 304 are completed (i.e., any time after the processed lot 22 is removed from the loadport and the new lot 24 has moved to the loadport. At step 305, the new lot 24 is transferred from the vehicle 312 to the tool 21 and input to the loadport.

Figure 1:
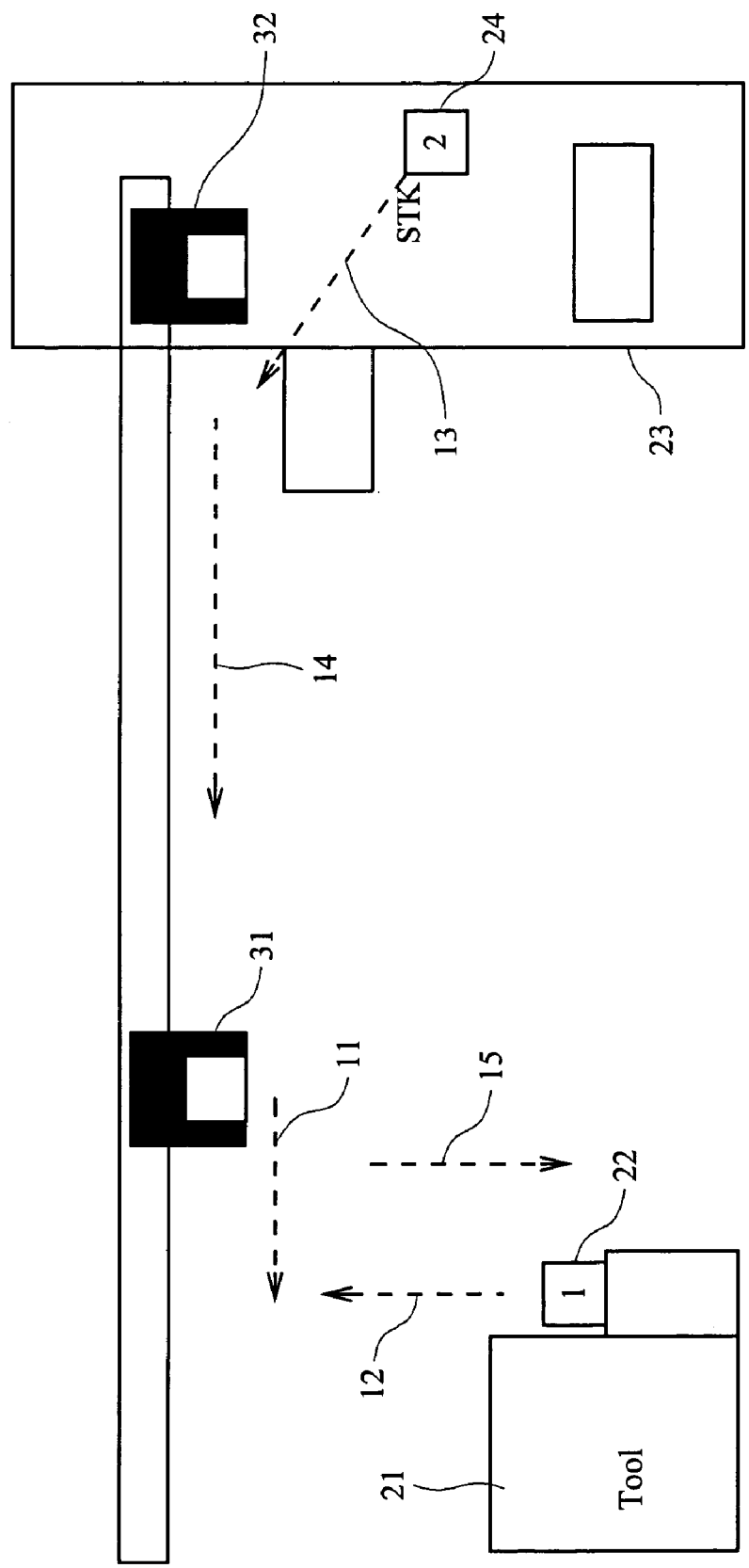
FIG. 1 is a diagram of a conventional method for operating an AMHS.
Figures 4A, 4B, 4C:
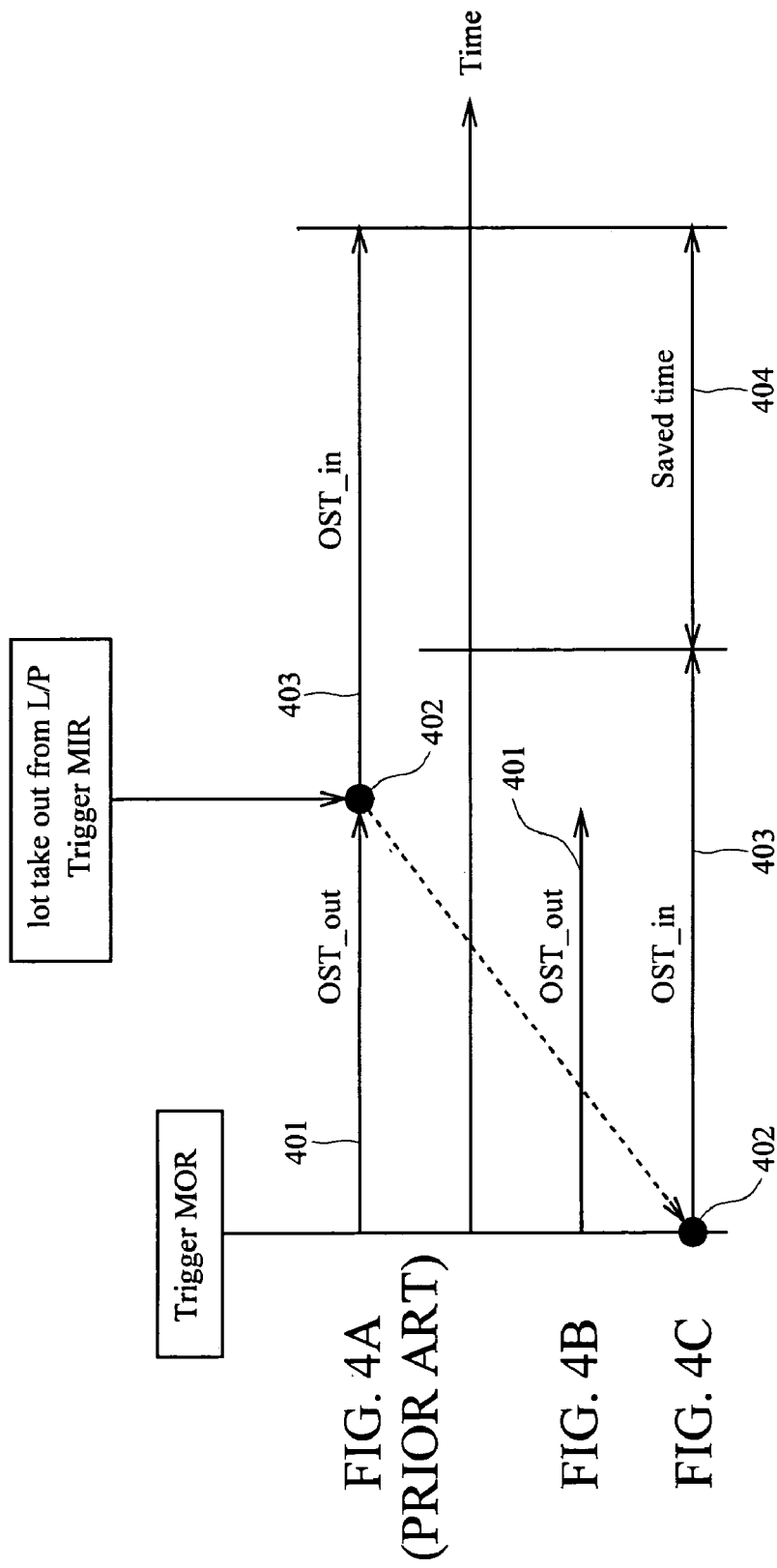
FIG. 4A is a timeline of the conventional method of FIG. 1.
FIGS. 4B and 4C are timelines of exemplary steps in the method of FIG. 3.

FIGS. 4A–4C show how the process sequence of FIG. 3 reduces the total OST. FIG. 4A shows a timeline for performing the prior art sequence of FIG. 1. In this sequence, the period 401 includes the time between when the loadport issues the move out request (MOR) to remove the lot 22 and the lot is picked up by vehicle 311. At time 402, the lot is picked up, triggering the move in request (MIR) from the loadport. The period 403 to deliver the new lot 24 to the loadport (LP) of the tool does not begin until time 402.

FIGS. 4B and 4C show timelines of one embodiment of the method of FIG. 3, in which the time 402 is moved back to the same time as the MOR. That is, the MIR is issued at the same time as the MOR. The period 403 can begin at the same time as the period 402. The total time to complete both the removal of lot 22 and the input of lot 24 becomes the longer of the two operation times, instead of their sum. As a result, an amount of time 404 corresponding to the shorter of the two times 401 and 403 is saved. In this example, the shorter time is the OST-out time, and the total time is reduced by that amount.

One of ordinary skill in the art will understand from FIGS. 4B and 4C that the removal operation for the processed lot can be shifted to any time period while the new lot is being moved towards the tool, with no impact on the total OST time. Alternatively, although the biggest time savings occurs when the MIR is issued at the same time as the MOR, a smaller reduction in total OST time can still be obtained by moving the MIR (time 402) back to any intermediate time during the OST_out period, while the empty vehicle is moving to the loadport or the processed lot is being transferred to the empty vehicle.

Figure 5:
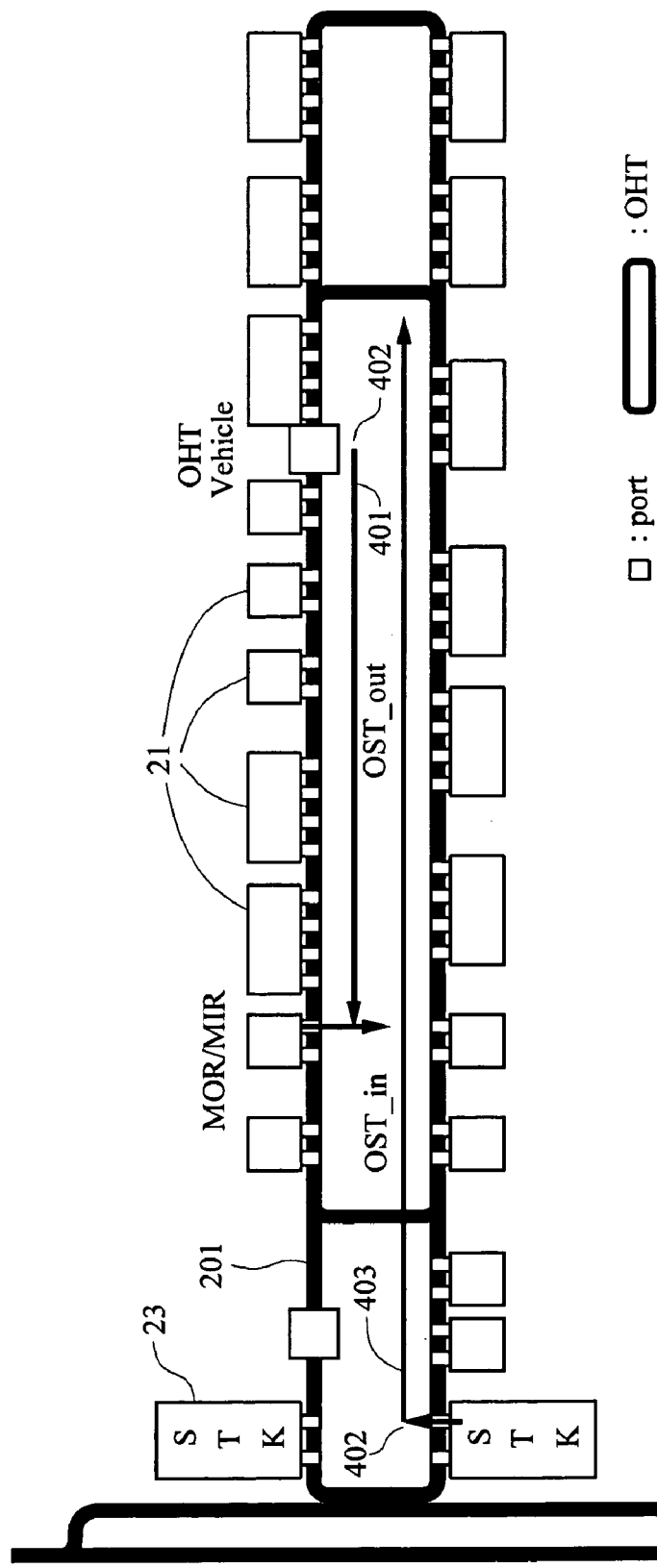
FIG. 5 is a diagram of one bay in the AMHS of FIG. 2.

FIG. 5 is an alternative representation showing the physical movements corresponding to the operations of FIGS. 4B and 4C. Time 402 is shown at both the beginning of movement of the vehicle for the removal of processed lot 22 and at the beginning of movement of the vehicle from the stocker 23 to bring the new lot 24 to the tool 21 exceeds the time to move the nearest empty vehicle to the tool to remove the lot 22. Thus a common situation is shown where the travel distance from the stocker 23 to the tool 21

In some embodiments, as shown by FIGS. 4B and 4C, the loadport of the tool 21 essentially can issue a "remove current lot" (MOR) command and a "move next lot" (MIR) command simultaneously. The AMHS 200 initiates movement of the next lot 24 to arrive at the loadport of the tool 21 before the processed lot 22 is removed from the loadport. Typically, it takes less time to move an empty vehicle to the loadport for removal of the processed lot 22 than the amount of time it takes to deliver a new lot 24 of wafers to the loadport. Thus, both operations can be initiated at the same time, and the empty vehicle can arrive at the loadport and pick up the lot 22 before the new lot 24 arrives at the loadport. The processed lot 22 can be removed from the loadport any time before the new lot 24 arrives. Thus, in some cases, it is even possible to begin moving an empty vehicle towards the loadport after the request to send the new lot 24 to the loadport has already been sent (as long as there is still time for the empty vehicle to arrive at the loadport and pick up the processed lot 22 before the new lot 24 arrives).

The "remove" and "move" commands are integrated so as to be triggered by a single command from the operation job supervisor (OJS) 220. The material control system (MCS) 214 receives a single triggering command from the OJS 220 and issues the "remove" (MOR) and "move" (MIR) requests in response to the triggering command. In response to the commands from the MCS 214, the AMHS 200 dispatches an empty vehicle to pick up the processed lot 22 and also triggers the stocker 23 through the OHT 203 to deliver the next lot of wafers to the loadport of the tool 21 for processing.

Figure 6:
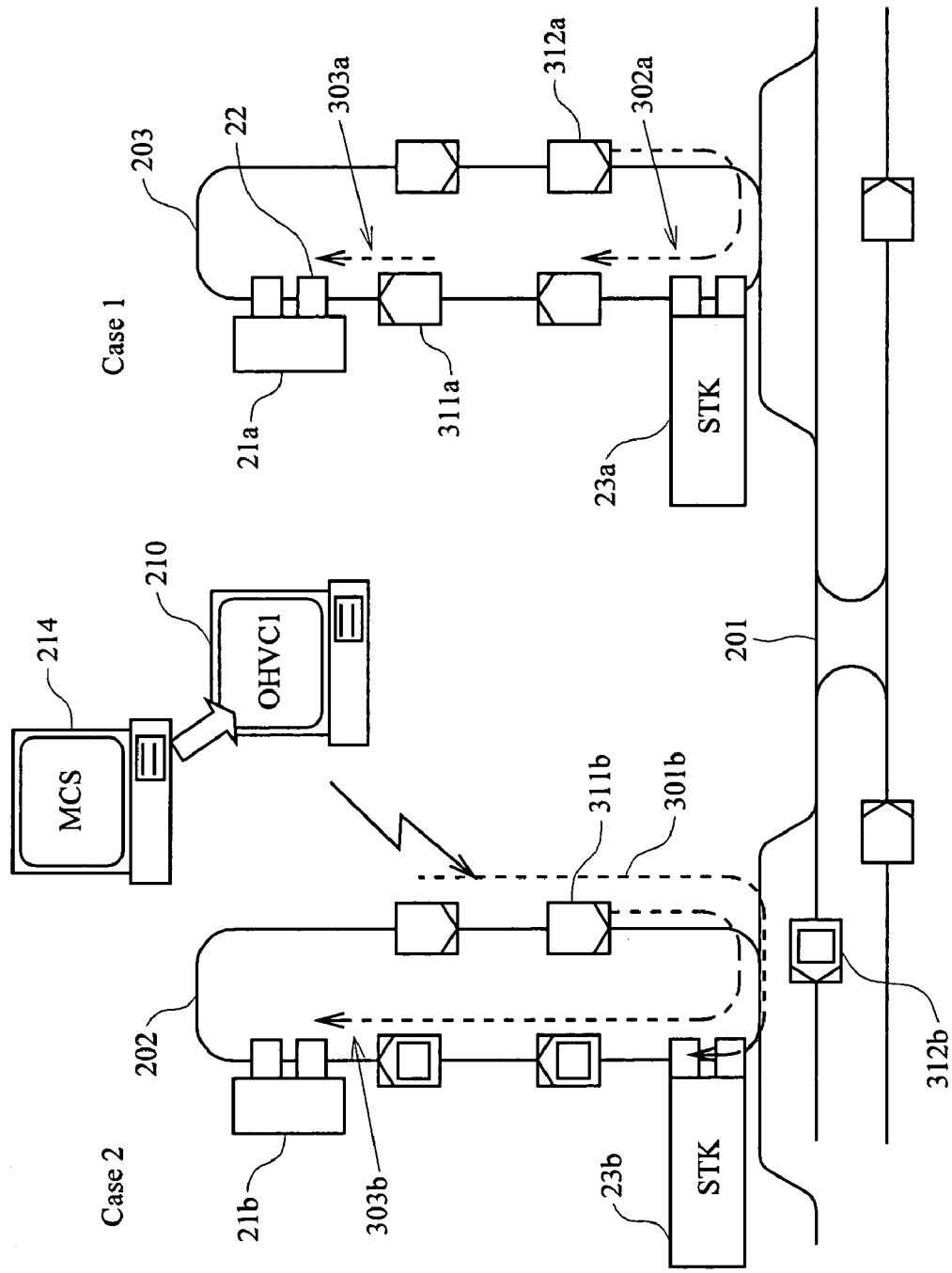
FIG. 6 shows timing of movement in two bays of the AMHS of FIG. 2.

In some embodiments, it is desirable to prioritize the MOR and MIR. FIG. 6 shows two different timing scenarios that can arise using the technique of FIG. 3. In the case 1, empty vehicle 311a makes a move 303a to remove a first lot 22 from the tool 21a, and a vehicle 312a picks up a new lot at the stocker 23a to transport to the tool 21a. The paths traveled by the two vehicles do not overlap. Thus, there is no contention for the resource of OHT 203, and both moves 302a and 303a can start at the same time without interfering with each other.

In the case 2, empty vehicle 311b makes a move 303b to remove a first lot 22 from the tool 21b, and a vehicle 312b picks up a new lot at the stocker 23b to transport to the tool 21b. Here, however, the movements of the two vehicles 311a and 311b use a common portion of the path of OHT 202. Regardless of whether the operations begin sequentially or simultaneously, the move-in operation cannot be completed until after the move-out operation is completed, because the processed lot must be removed from the tool before the second lot is input. To make sure the operations are successful, the MCS 214 can use prioritization to make sure that the empty vehicle 311b begins to move no later than the vehicle 312b containing the new lot.

Alternatively, the MCS 214 can control the movements so that, if the empty vehicle 311b must pass the stocker 23b on the way to the tool 21b, then the vehicle 312b containing the second lot does not leave the stocker 23b until the vehicle 311b passes the stocker 23b. This prevents a deadlock situation in which the empty vehicle is stuck behind the new lot, but the new lot cannot be input because the first lot has not yet been removed. In this scenario, the OST_out time begins before the OST_in time, but the two time periods can overlap, so that there is still a reduction in the total OST time.

Figure 7:
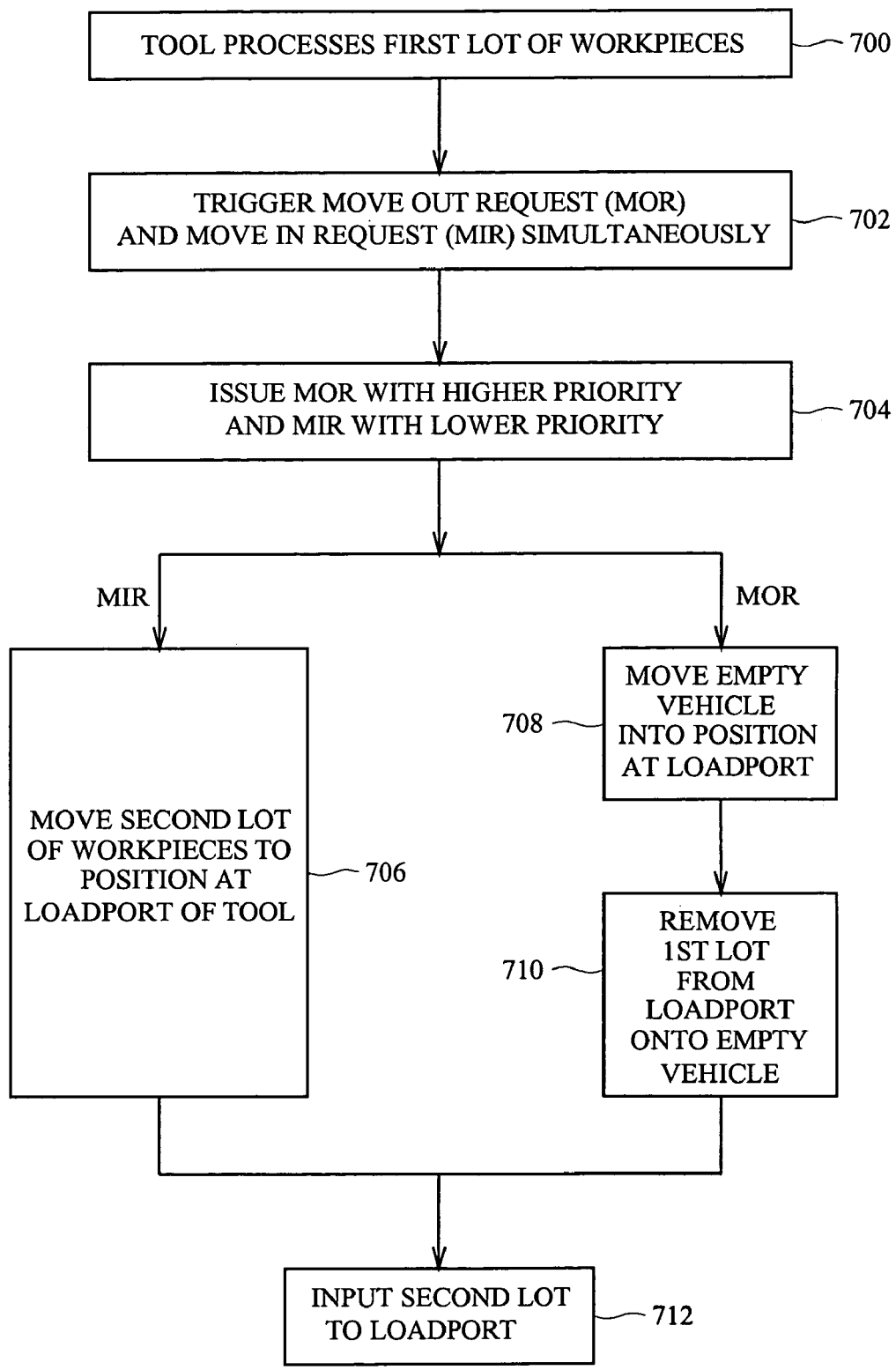
FIG. 7 is a flow chart showing operation of the AMHS of FIG. 2.

FIG. 7 is a flow chart diagram showing a method for operating an automated material handling system, for example, in a semiconductor fabrication facility. The facility has at least one processing tool that performs a process on workpieces, for example, performing a semiconductor fabrication process on semiconductor wafers. Preferably the method is performed in a facility having at least one stocker capable of holding at least one lot of semiconductor wafers, and also having first and second transports.

At step 700, a tool processes a first lot of workpieces (such as semiconductor wafers).

At step 702, the OJS 220 issues a trigger command to the MCS 214, to initiate the MOR and MIR.

At step 704, the MCS 214 then issues the MOR and MIR simultaneously to the OHVCs 210 of the AMHS, assigning a higher priority to the MOR and a lower priority to the MIR. The OHVC 210 in turn issues a first command to the stocker in response to the MIR, wherein the new lot is dispatched in response to the first command. The MCS 214 issues a second command to the OHVC 210 in response to the MOR, not before the first command is issued, where the first transport is moved to the loadport for removal of the first lot in response to the second command.

At step 706, the second transport moves a second lot of semiconductor wafers from the stocker to a loadport of the processing tool.

At step 708, the first transport moves an empty vehicle into position to remove the first lot of semiconductor wafers from the tool while the second lot of semiconductor wafers is being moved. Although FIG. 7 shows steps 706 and 708 beginning at exactly the same time, this is not a requirement.

At step 710, the first transport removes the first lot of semiconductor wafers from the tool with the vehicle while the second lot of semiconductor wafers is being moved.

At step 712, the second lot is input to the loadport of the tool.

Although the examples described above refer to a system in which the OST_in time is longer than the OST_time, it is also possible to reduce the cycle time even in a case where the OST_time is longer than the OST_in time (for example, if there is a delay in moving an empty vehicle to the loadport). The stocker can dispatch a vehicle containing the second lot towards the loadport while the empty vehicle is moving to the loadport and/or outputting the processed lot from the loadport to the empty vehicle. Then the vehicle containing the second lot waits until the processed lot is removed before inputting the new lot into the loadport. Because the step 305 of inputting the new lot 24 from the vehicle into the loadport cannot begin until step 304 of removing the processed lot 22 has completed, the saved time is less than the full amount of the OST_in time (where the OST_in time comprises the duration of steps 301, 302 and 305). In this case, the saved time is the portion of the OST_in time required to perform steps 301 and 302. That is, the time saving is reduced by the time to perform step 305.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, ZIP™ disks, memory sticks, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for operating an automated material handling system in a semiconductor fabrication facility, comprising the steps of:
   (a) issuing a command to a remote stocker resulting in automated movement of a unit containing a second lot of semiconductor wafers from the stocker to a loadport of a processing tool after a first lot of semiconductor wafers is processed by the tool;
   (b) moving an empty vehicle into position to remove the first lot of semiconductor wafers while the second lot of semiconductor wafers is being moved; and
   (c) removing the first lot of semiconductor wafers from the tool with the vehicle while the second lot of semiconductor wafers is being moved.

2. The method of claim 1, further comprising:
   issuing a further command to the automated material handling system not earlier than the command is issued, wherein step (b) is performed in response to the further command.

3. The method of claim 2, wherein the further command is issued with a higher priority than the command, thereby ensuring that step (b) is initiated no later than step (a) is initiated.

4. The method of claim 2, wherein the command and the further command are triggered simultaneously.

5. A method for operating an automated material handling system in a semiconductor fabrication facility, comprising:
   (a) issuing a first command to a stocker
   (b) moving a second lot of semiconductor wafers from the stocker to a loadport of a processing tool after a first lot of semiconductor wafers is processed by the tool, responsive to the issuing a first command;
   (c) issuing a second command to the automated material handling system not earlier than the first command is issued;
   (d) moving an empty vehicle into position to remove the first lot of semiconductor wafers while the second lot of semiconductor wafers is being moved, responsive to the issuing a second command; and
   (e) removing the first lot of semiconductor wafers from the tool with the vehicle while the second lot of semiconductor wafers is being moved.

* * * * *

UNITED STATES PATENT AND TRADEMARK OFFICE
CERTIFICATE OF CORRECTION

PATENT NO. : 7,024,275 B2
APPLICATION NO. : 10/701579
DATED : April 4, 2006
INVENTOR(S) : Samson Lai It is certified that error appears in the above-identified patent and that said Letters Patent is hereby corrected as shown below:

Column 5, line 43, replace "OST_time" with --OST_out time--.
Column 5, line 45, replace "OST_time" with --OST_out time--.

Signed and Sealed this

Thirtieth Day of January, 2007

JON W. DUDAS
*Director of the United States Patent and Trademark Office*